United States Patent [19]
Tihanyi

[11] Patent Number: 5,973,360
[45] Date of Patent: Oct. 26, 1999

[54] FIELD EFFECT-CONTROLLABLE SEMICONDUCTOR COMPONENT

[75] Inventor: Jenoe Tihanyi, Kirchheim, Germany

[73] Assignee: Siemens Aktiengesellschaft, Munich, Germany

[21] Appl. No.: 09/157,704

[22] Filed: Sep. 21, 1998

Related U.S. Application Data

[63] Continuation of application No. PCT/DE97/00528, Mar. 14, 1997.

[30] Foreign Application Priority Data

Mar. 20, 1996 [DE] Germany .......................... 196 11 045

[51] Int. Cl.$^6$ .................................................. H01L 29/76
[52] U.S. Cl. ........................... 257/330; 257/331; 257/401
[58] Field of Search .................................. 257/329–334, 257/401; 438/268–274

[56] References Cited

U.S. PATENT DOCUMENTS

| | | |
|---|---|---|
| 4,914,058 | 4/1990 | Blanchard . |
| 4,941,026 | 7/1990 | Temple . |
| 5,072,269 | 12/1991 | Hieda ...................................... 257/302 |
| 5,126,807 | 6/1992 | Baba et al. . |
| 5,216,275 | 6/1993 | Chen . |
| 5,430,315 | 7/1995 | Rumennik . |
| 5,438,215 | 8/1995 | Tihanyi . |
| 5,559,353 | 9/1996 | Risch et al. .............................. 257/331 |
| 5,747,831 | 5/1998 | Loose et al. ............................. 257/334 |
| 5,883,411 | 3/1999 | Ueda et al. .............................. 257/331 |

FOREIGN PATENT DOCUMENTS

| | | | |
|---|---|---|---|
| 0477873A2 | 4/1992 | European Pat. Off. . | |
| 355065463 | 5/1980 | Japan ..................................... | 257/331 |
| 356083074 | 7/1981 | Japan ..................................... | 257/331 |
| 402114567 | 4/1990 | Japan ..................................... | 257/330 |
| 405335582 | 12/1993 | Japan ..................................... | 257/331 |
| 2089118A | 6/1982 | United Kingdom . | |

OTHER PUBLICATIONS

Japanese Patent Abstract No. 60208863 (Hiroshi), dated Oct. 21, 1985.
"Siemens Technische Angaben", Semiconductor Group, pp. 28–65.

*Primary Examiner*—Tom Thomas
*Assistant Examiner*—Ori Nadav
*Attorney, Agent, or Firm*—Herbert L. Lerner; Laurence A. Greenberg

[57] ABSTRACT

The field effect-controllable semiconductor component has a drain zone of the first conductivity type and also at least one gate electrode which is composed of polycrystalline silicon and is insulated from the drain zone. A source region of the second conductivity type is introduced in the drain zone. In addition, there is formed in the drain zone a trench structure, which reach from the surface of the epitaxial layer down into the substrate layer. An additional field plate made of polysilicon and embedded in an oxide layer is introduced in the trench structure. The thickness of the oxide surrounding the field plate increases down in a direction towards the drain.

10 Claims, 4 Drawing Sheets

FIELD EFFECT-CONTROLLABLE SEMICONDUCTOR COMPONENT

CROSS-REFERENCE TO RELATED APPLICATION

This is a continuation of copending international application PCT/DE97/00528, filed Mar. 14, 1997, which designated the United States.

BACKGROUND OF THE INVENTION

1. Field of the Invention

The invention lies in the semiconductor electronics field. More specifically, the invention relates to a field effect-controllable semiconductor component with a drain zone of the first conductivity type, at least one gate electrode composed of polycrystalline silicon and insulated from the drain zone, and at least one source region of the second conductivity type introduced in the drain zone.

A field effect-controllable semiconductor component of this type is a vertical MOS field-effect transistor, for example. Those transistors have been known for a long time. A description may be found, for example, in Siemens Datenbuch 1993–94 SIPMOS-Halbleiter, Leistungstransistoren und Dioden [Siemens Data Book 1993–94 SIPMOS Semiconductors, Power Transistors and Diodes], page 29 ff. FIG. 4 on page 30 of the Data Book shows the fundamental structure of such a power transistor. There, the $n^+$-type substrate serves as carrier with the underlying drain metallization layer. The $n^+$-type substrate is adjoined above it by an $n^-$-type epitaxial layer, which has a different thickness depending on the reverse voltage and is correspondingly doped. The superior gate made of $n^+$-type polysilicon is embedded in insulating silicon dioxide and serves as an implantation mask for the p-type well and for the $n^+$-type source zone. The source metallization layer covers the entire structure and connects the individual transistor cells of the chip in parallel. Further details can be found on page 30 ff. of the Data Book.

The disadvantage of a configuration of that type is that the forward resistance $R_{on}$ of the drain-source load path increases as the dielectric strength of the semiconductor component increases, since the thickness of the epitaxial layer must increase. At 50 V, the forward resistance $R_{on}$ per unit area is approximately 0.20 $\Omega$mm$^2$ and rises at a reverse voltage of 1000 V to a value of approximately 10 $\Omega$mm$^2$, for example.

In order to solve this problem, the IGBT was developed, which mixes MOS and bipolar functions in order to be turned on better. Such a transistor is slower than a MOSFET, however.

It is know in lateral field-effect transistors, to design the gate in such a way that it rises in step-like or linear fashion, for example, in the direction toward the drain electrode. The breakdown voltage increases with an increasing distance between the gate electrode and the channel region. The saturation voltage increases as well. A cascade circuit of a plurality of field-effect transistors with increasing breakdown voltages and lower saturation voltages is realized, in principle, by a structure of this type. However, lateral transistors require a large area.

U.S. Pat. No. 5,216,275 to Chen discloses a semiconductor component in which the drain layer applied to the substrate comprises vertical alternately p-doped and n-doped layers. The prior patent shows those layers in FIG. 4 of the description, for example. The p-type layers are designated by 7 and the n-type type layer by 6. The description, in particular column 2, line 8, reveals that the alternate p-type and n-type layers must each be connected to the $p^+$-type and the $p^-$-type region, respectively. However, this leads to a severe restriction in the design of a semiconductor component since the edge regions can no longer be freely configured.

My earlier U.S. Pat. No. 5,438,215 discloses a power MOSFET which has a high blocking capability and a reduced forward resistance. However, such a component is difficult to fabricate.

SUMMARY OF THE INVENTION

It is accordingly an object of the invention to provide a field effect-controllable semiconductor component which overcomes the above-mentioned disadvantages of the heretofore-known devices and methods of this general type and which provides a low forward resistance in spite of a high reverse voltage.

With the foregoing and other objects in view there is provided, in accordance with the invention, a field effect-controllable semiconductor component, comprising:

a semiconductor body having a surface;

a drain zone of a first conductivity type in the semiconductor body;

a gate electrode composed of polycrystalline silicon in the semiconductor body, the gate electrode being insulated from the drain zone;

a source region of a second conductivity type introduced in the drain zone;

the drain zone having a trench structure formed therein reaching from the surface of the semiconductor body into the drain zone; and a field plate in the trench structure and an oxide layer surrounding the field plate, the oxide layer having a thickness increasing in a direction towards the drain zone.

In accordance with an added feature of the invention, a further layer surrounds the oxide layer and the further layer is doped more heavily with the first conductivity type than the drain zone.

In accordance with an additional feature of the invention, at least one additional layer of the second conductivity type is introduced into the oxide layer surrounding the field plate.

In accordance with another feature of the invention, the trench structure is one of a multiplicity of trench structures arranged in grid or strip form in the semiconductor body.

In accordance with a further feature of the invention, the field plate is electrically connected to a source terminal of the source region.

In accordance with again a further feature of the invention, the field plate is electrically connected to the gate electrode.

In accordance with again another feature of the invention, the field plate is a vertical field plate serving as a gate.

In accordance with a concomitant feature of the invention, the field plate is composed of polysilicon.

The advantage of the present invention is that the previously mentioned advantages of a lateral field-effect transistor can also be utilized according to the invention in a vertical field-effect transistor, in that the gate or an insulated additional field plate electrode which is introduced into the substrate in the vertical direction has, with increasing depth, an increasing distance from the surrounding insulating gate oxide.

A further advantage is that a trench structure of this type can be arranged in grid form or in strip form around the individual transistor cells and, consequently, optimum influencing of the space charge zone is made possible.

Depending on the configuration of the vertical additional electrode, the latter may be electrically connected to source or gate or else be designed in such a way that it forms part of the gate electrode or forms the gate electrode itself.

Other features which are considered as characteristic for the invention are set forth in the appended claims.

Although the invention is illustrated and described herein as embodied in a field effect-controllable semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
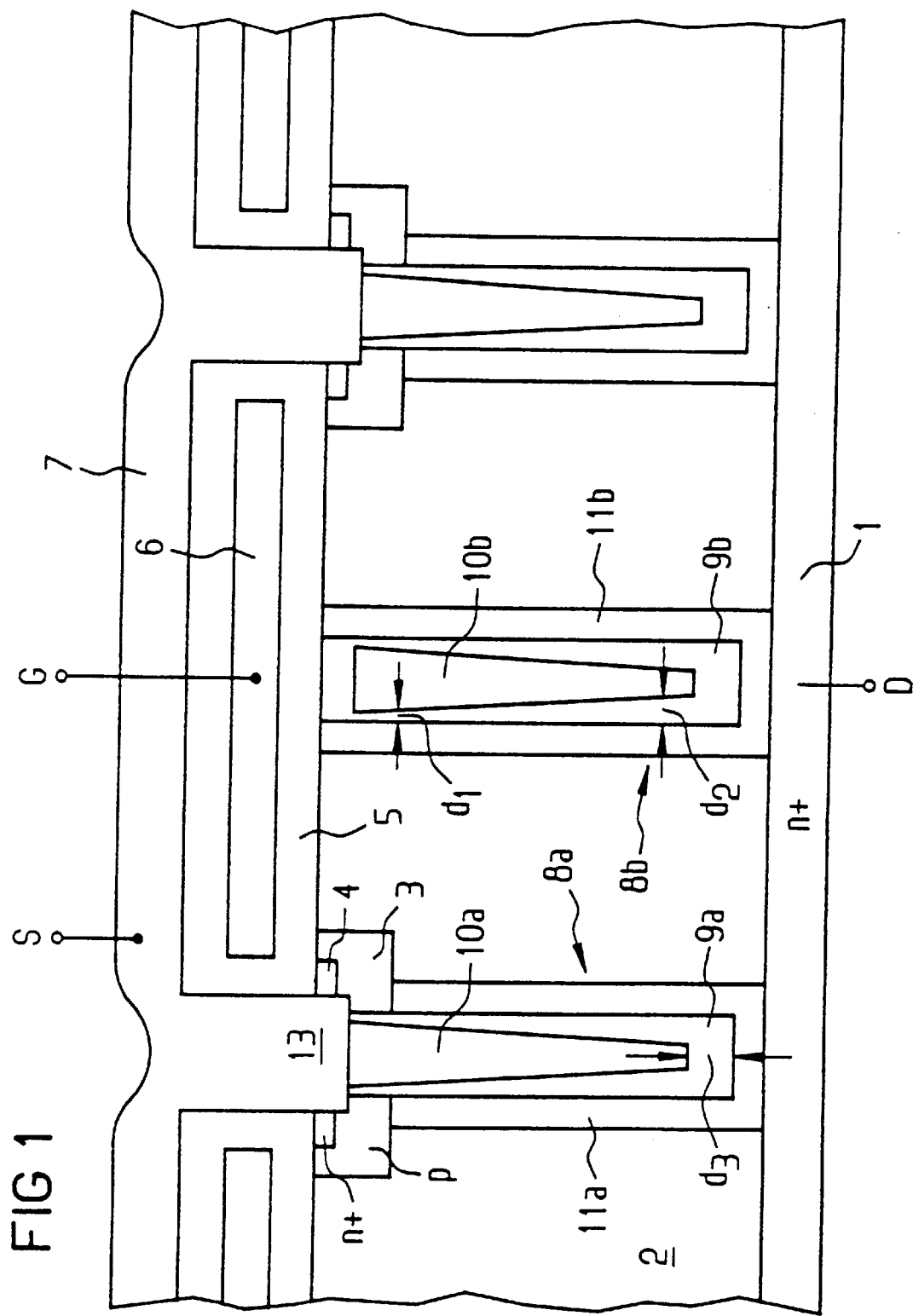
FIG. 1 is a partial schematic sectional view a first exemplary embodiment of a vertical MOS field-effect transistor according to the invention.

Referring now to the figures of the drawing in detail and first, particularly, to FIG. 1 thereof, there is seen a vertical MOSFET with an $n^+$-doped substrate which, on the rear side, is provided with a drain terminal, for example a metallization layer. Deposited over this layer 1 is an $n^-$-doped epitaxial layer 2, in which p-doped source regions 3 are introduced. The p-doped source regions 3 have embedded $n^+$-type regions 4. A source metallization layer 7 forms a short circuit between the $n^+$-type and p-type source regions 3, 4. FIG. 1 illustrates two of these source regions 3, 4, which are spaced apart from one another and whose intermediate region, in each case in conjunction with the drain zone 1, 2, forms a channel, above which is arranged, embedded in gate oxide 5, a gate 6.

Extending underneath the gate 6 into the epitaxial layer 2 is a recess in the form of a trench. An auxiliary electrode 10b is disposed in the trench and surrounded by an insulating gate oxide 9b. The auxiliary electrode 10b is of wedge-shaped design, with the result that as the distance from the surface facing the gate increases into the epitaxial layer 2, the thickness of the insulating gate oxide 9b increases. Consequently, in the example illustrated, a distance d1 is less than a distance d2 and d3 (d1<d2<d3). In the exemplary embodiment illustrated in FIG. 1, moreover, the trench walls 11b are $n^+$-doped. In addition to the trench structure 8b situated under the gate, a similar trench structure is also formed underneath the source electrode. The trench 8a formed there extends from the source metallization layer 13 through the source region 3 in the direction of the drain through the epitaxial layer 2. The additional electrode of wedge-shaped design in this case extends from the source metallization layer, to which it is conductively connected, in the direction of the drain in the same way as the auxiliary electrode 10b. Beginning underneath the source electrode 3, the trench walls 11a are once again $n^+$-doped.

Figure 2:
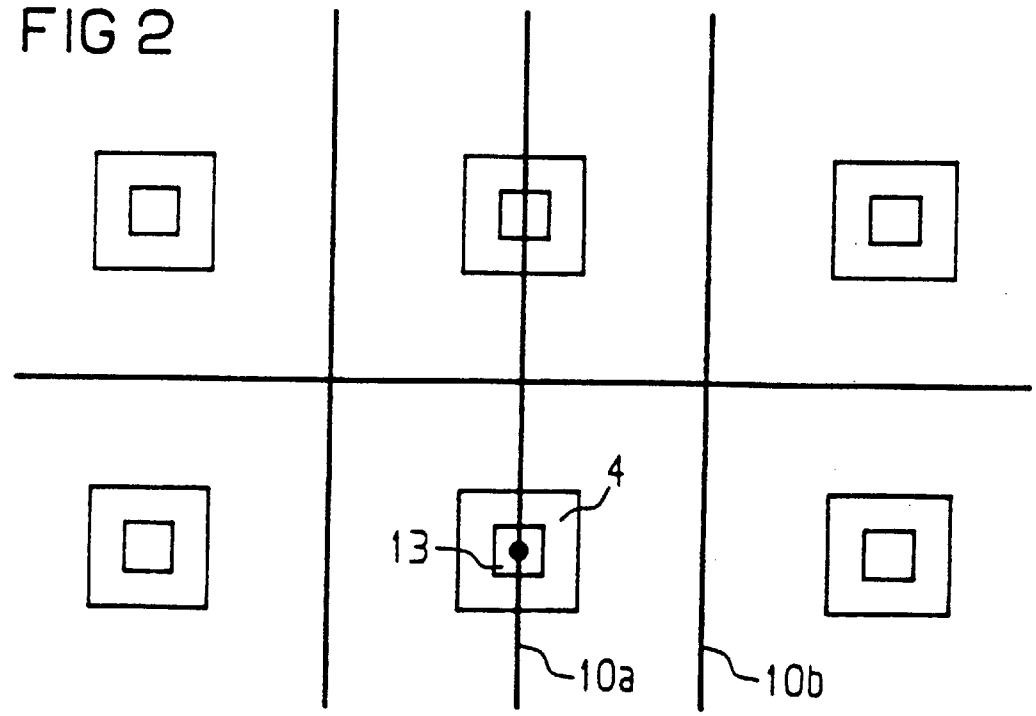
FIG. 2 is a plan view onto a detail of the field-effect transistor according to the invention as shown in FIG. 1.

FIG. 2 shows how the auxiliary electrodes 10a and 10b can be connected to one another and to the source regions. The auxiliary electrodes 10a and 10b and further auxiliary electrodes not illustrated in FIG. 1 form a structure in grid form which, on the one hand, surrounds the source regions and, on the other hand, traverses the source regions. In this case, as illustrated in FIG. 1, the additional auxiliary electrodes 10a, 10b may be connected to the source metallization layer through individual source cells. Of course, all the auxiliary electrodes which traverse source regions can be respectively connected to the source metallization layer. At the crossover points of the auxiliary electrodes 10a and 10b designed in the form of a grid, the auxiliary electrodes are likewise connected to one another and thus form an annular structure which surrounds the individual transistor cells. A strip structure is also possible.

The method of operation of such a vertical MOSFET essentially corresponds to that of known lateral MOSFETs with an additional field plate whose distance from the epitaxial layer increases in the direction of the drain.

Figure 3:
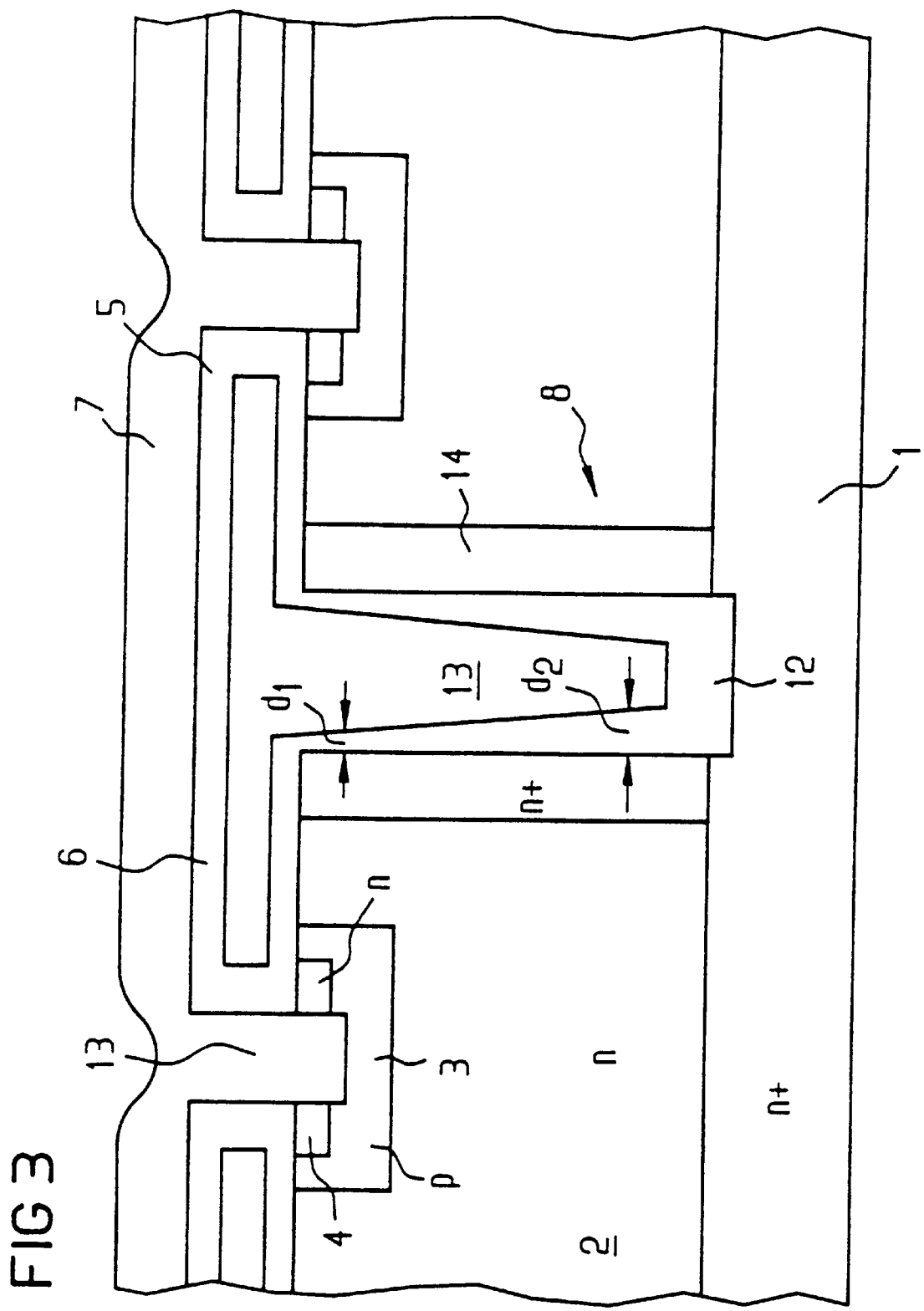
FIG. 3 is a partial schematic sectional view of a second exemplary embodiment of the MOS field-effect transistor according to the invention.

A further exemplary embodiment is illustrated in FIG. 3. There, the auxiliary electrode is likewise of wedge-shaped design in the vertical direction, but is directly connected to the gate 6. Identical elements have the same reference symbols. In this case, the additional, wedge-shaped, auxiliary electrode 13 is thus part of the gate and is thus embedded completely in the gate oxide 5 and also the gate oxide 12 of the trench 8. The trench in this case extends down into the substrate 1, only the side walls 14 being $n^+$-doped in this exemplary embodiment.

Figure 4:
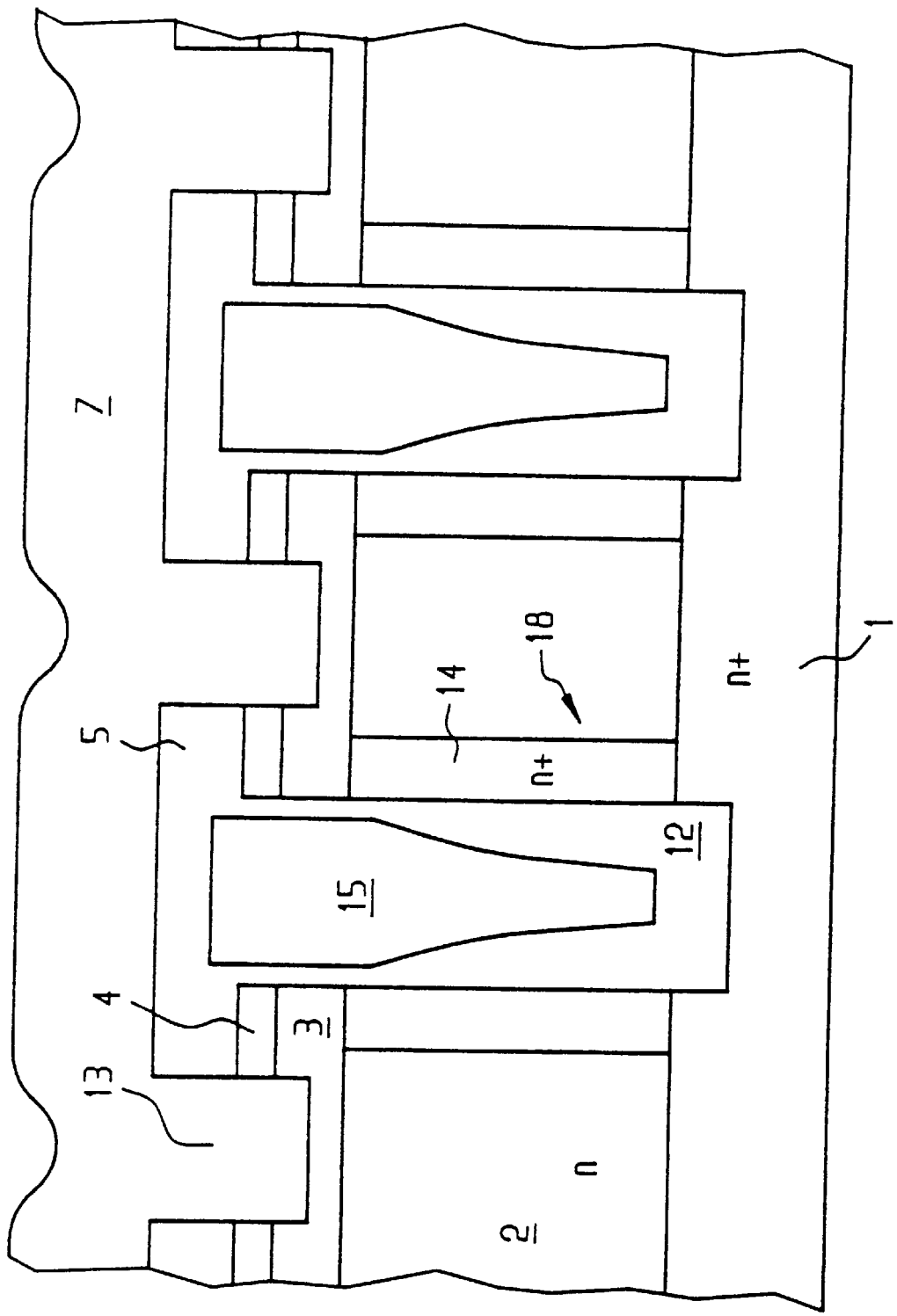
FIG. 4 is a similar view of a third exemplary embodiment of the MOS field-effect transistor according to the invention.

FIG. 4 shows a development of the configuration of FIG. 3. In this case, use is made of the trench technology which is known from memory technology. The difference from trenches known to date is that the combined gate field-plates are in this case formed once again in a partially wedge-shaped manner, with the result that the thickness of the gate oxide 12 surrounding them increases in the direction of the drain. This combined gate field-plate structure is designated by 15 in FIG. 4. In this case, the wedge-shaped configuration begins approximately starting from the end of the source zone 3 in the direction toward the drain terminal.

The $n^+$-type layer implanted outside the trench has a doping of less than about $10^{12}$ cm$^{-2}$. It is intended to be high enough that avalanche breakdown still does not occur in the layers 14 in the event of full depletion. As illustrated, the additional auxiliary electrode may be composed of $n^+$-type polysilicon and it may be connected either to the source contact or else to the gate terminal.

Figure 5:
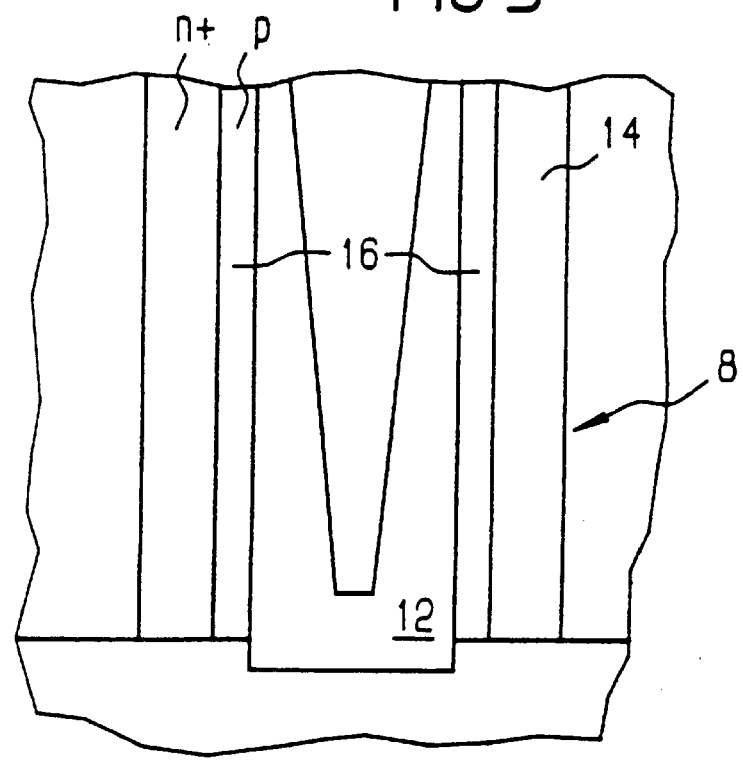
FIG. 5 is a sectional view of a detail of a trench structure of a further MOS field-effect transistor according to the invention.

FIG. 5 illustrates a detail of the trench structure according to FIG. 3. In this case, a further p-doped layer 16 is additionally introduced into the edge region of the trench. It is also possible to introduce a plurality of alternate p-doped or n-doped layers, or to interchange the arrangement according to FIG. 5 so that the $n^+$-type layer 14 is on the inside and the p-type layer 16 is on the outside. The layer 16 can be produced by ion implantation.

The structures according to the invention have been explained in the form of an N-channel FET but can also equally well be realized with corresponding opposite doping in a P-channel version.

The edge of a transistor that is constructed in such a way can be designed like that of currently customary power MOSFETs.

The trench walls 11a, 11b, 14, 16 can be doped by ion implantation, for example, at an angle to the trench wall. It is intended to be high enough that avalanche breakdown still does not occur in the layers 14 in the event of full depletion.

I claim:

1. A field effect-controllable semiconductor component, comprising:
    a semiconductor body having a surface;
    a drain zone of a first conductivity type in said semiconductor body;
    a gate electrode composed of polycrystalline silicon in said semiconductor body, said gate electrode being insulated from said drain zone;
    a source region of a second conductivity type introduced in said drain zone;
    said drain zone having a trench structure formed therein reaching from said surface of said semiconductor body into said drain zone; and
    a field plate in said trench structure and an oxide layer surrounding said field plate, said oxide layer having a thickness increasing gradually and continuously from said surface in a direction towards said drain zone.

2. The semiconductor component according to claim 1, which further comprises a further layer surrounding said oxide layer, said further layer being doped more heavily with the first conductivity type than said drain zone.

3. The semiconductor component according to claim 2, which further comprises at least one additional layer of the second conductivity type introduced into said oxide layer surrounding said field plate.

4. The semiconductor component according to claim 1, wherein said trench structure is one of a multiplicity of trench structures arranged in grid form in said semiconductor body.

5. The semiconductor component according to claim 1, wherein said trench structure is one of a multiplicity of trench structures arranged in strip form in said semiconductor body.

6. The semiconductor component according to claim 1, wherein said field plate is electrically connected to a source terminal of said source region.

7. The semiconductor component according to claim 1, wherein said field plate is electrically connected to said gate electrode.

8. The semiconductor component according to claim 7, wherein said field plate is a vertical field plate serving as a gate.

9. The semiconductor component according to claim 1, wherein said field plate is composed of polysilicon.

10. The semiconductor component according to claim 1, wherein said field plate is composed of polysilicon.

* * * * *